(12) United States Patent
Yasukawa et al.

(10) Patent No.: US 6,410,978 B1
(45) Date of Patent: **\*Jun. 25, 2002**

(54) SEMICONDUCTOR DEVICE

(75) Inventors: Akio Yasukawa, Kashiwa; Hirohisa Yamamura, Hitachiota; Tatsuya Shigemura, Hitachinaka, all of (JP)

(73) Assignee: Hitachi, Ltd., Tokyo (JP)

( \* ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/370,990

(22) Filed: Aug. 10, 1999

(51) Int. Cl.[7] .................. H01L 23/34; H01L 23/48; H01L 23/52; H01L 29/40
(52) U.S. Cl. .................. 257/678; 257/713; 257/714; 257/783
(58) Field of Search .................. 438/106; 257/678, 257/713, 714, 783

(56) References Cited

U.S. PATENT DOCUMENTS

| 4,920,574 A | \* | 4/1990 | Yamamoto et al. |
| 5,613,552 A | \* | 3/1997 | Osakabe et al. |
| 6,140,144 A | \* | 10/2000 | Najafi et al. |

FOREIGN PATENT DOCUMENTS

JP          10-22428          1/1998

\* cited by examiner

Primary Examiner—David E. Graybill
(74) Attorney, Agent, or Firm—Antonelli, Terry, Stout & Kraus, LLP

(57) ABSTRACT

A semiconductor device in which fatigue failure of a solder layer underneath a semiconductor chip mounted on a base can be prevented from occurring due to repetitions of turn-on and -off of power during operation thereof, is provided, that is, a recess is formed in the base in a part underneath the semiconductor chip so as to prevent occurrence of thermal expansion in the base.

20 Claims, 2 Drawing Sheets

SEMICONDUCTOR DEVICE

BACKGROUND OF THE INVENTION

1. Filed of the Invention

The present invention relates to a semiconductor device having a base on which a semiconductor chip is mounted.

2. Related Art

In a conventional semiconductor device as disclosed in Japanese Laid-Open Pat. No. H10-22428, a base to which a semiconductor chip is joined, is flat. With the repetitions of turn-on and -off of power in this device during use thereof, the temperature rise is repeated in a part of the base in which the semiconductor chip is joined and, accordingly, a solder layer underneath the semiconductor chip will crack due to fatigue, resulting in a problem of damage to the device. Thus, there is a need to solve the above-mentioned problem.

SUMMARY OF THE INVENTION

The present invention is devised in order to solve the above-mentioned problem inherent to the above-mentioned prior art device and, accordingly, one object of the present invention is to provide a semiconductor device which can reduce strain caused in a solder layer joined to a semiconductor chip so as to be prevented from incurring a fatigue failure.

To that end, according to the present invention, there is provided a semiconductor device comprising a base, and a semiconductor chip mounted on the base, wherein a recess is formed in the base in a part underneath the semiconductor chip.

The present invention will be detailed in the form of a preferred embodiment with reference to the accompanying drawings in which:

DESCRIPTION OF THE PREFERRED EMBODIMENT

Figure 1:
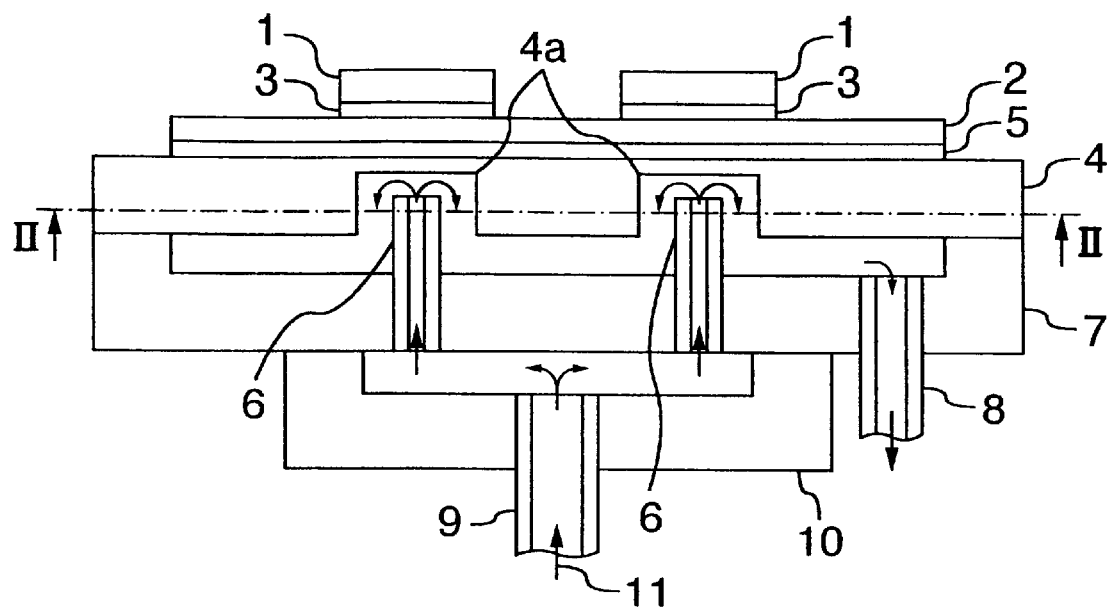
FIG. 1 is a cross-sectional view illustrating a semiconductor device in an embodiment of the present invention.

Referring to FIG. 1, a plurality of semiconductor chips 1 are joined onto an insulating substrate 2 through the intermediary of a solder layer 3, and the insulating substrate 2 is, in turn, joined onto a base 4 through the intermediary of a solder layer 5. The base 4 is formed therein with recesses 4a in a surface thereof on the side remote from the semiconductor chips in parts corresponding respectively to the chips 1 mounted thereon. The base 4 is joined thereto with an intermediate board 7 for covering the recesses 4a, by means of a brazing filler material. The thickness of the brazing filler material is very thin and, accordingly, the brazing filler material is not shown in the accompanying drawings. A plurality of nozzles 6 are joined to the intermediate board 7 by a brazing filler material. The nozzles 6 are located respectively at positions corresponding to the recesses 4a, respectively. Further, a outflow pipe 8 is brazed to the intermediate board 7, and a lower board 10, to which an inflow pipe 9 is brazed, is brazed to the intermediate board 7 so as to cover inflow holes in the nozzles 6.

When the device is operated so as to generate a heat from the chips 1, cooling liquid 11 is led into the device from the inflow pipe 9, and then, the cooling liquid 11 flows through the nozzles 6 and impinges upon the bottoms of the recesses 4a. Thereafter, the cooling liquid 11 flows around the nozzles 6 and is discharged from the device after flowing through the outflow pipe 8. In this embodiment, the insulating substrate 2 is made of AlN, and the base 4 is made of Cu or Al. With the combination of the materials having high heat-conductivity, the heat generated from the chips 1 can be effectively transmitted to the cooling liquid 11.

Since the heat generated from the chips, during the operation of the device, is transmitted to the cooling liquid 11 by way of the base underneath the chips 1, the temperature of the base 4 in parts underneath the chips 1 rises up. At this time, in the conventional device, great thermal expansion occurs in the base since no recesses are formed in these parts and, accordingly, the lower parts of the insulating substrate 2 underneath the chips 1 are expanded so as to produce large strain in the solder layer 3 between the insulating substrate 2 and the chips 1. With the repetitions of turn-on and -off of power, this strain is repeatedly effected. Thus, there has been presented a problem of occurrence of fatigue failure of the soldering layer.

Figure 3:
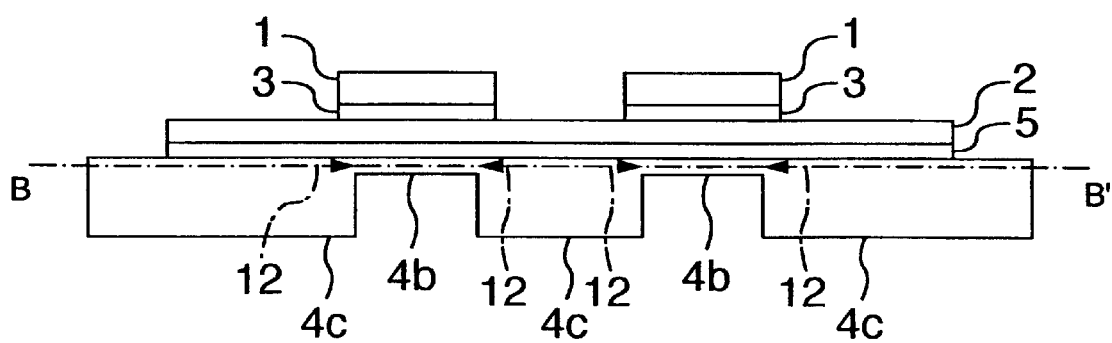
FIG. 3 is sectional view for explaining the operation of the semiconductor device shown in FIG. 1.
Figure 4:
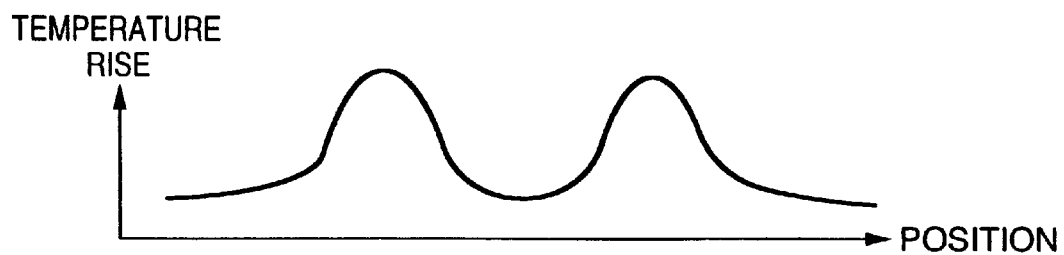
FIG. 4 is a characteristic view showing a temperature distribution in the base shown in FIG. 3.

On the contrary, in the instant embodiment, since the recesses 4a are formed in the base 4, the parts 4b of the base underneath the chips 1 are thin, and are surrounded therearound by parts 4c having a thickness larger than that of the parts 4b. In this arrangement, the temperature is distributed so that it is high in the thin parts 4b underneath the chips, but is lower in the thick parts 4c, as shown in FIG. 4 which shows a temperature distribution on a straight line passing through the center line of the chips as viewed at a plan B–B' in FIG. 3 and from the above. Accordingly, with reference to FIG. 3, even though the thin parts 4b tend to thermally expand, the thermal expansion of the thin parts 4b are restrained by the thick parts 4c therearound, having a low temperature. That is, restraining force 12 is effected so as to restrain expansion. Thus, it is possible to prevent occurrence of fatigue failure of the solder layer.

With the provision of the recesses 4a, as to the solder layer 5 for joining the insulating substrate, the strain can be decreased though a similar mechanism, thereby it is possible to exhibit such a technical effect and advantage that fatigue failure can be prevented.

Figure 2:
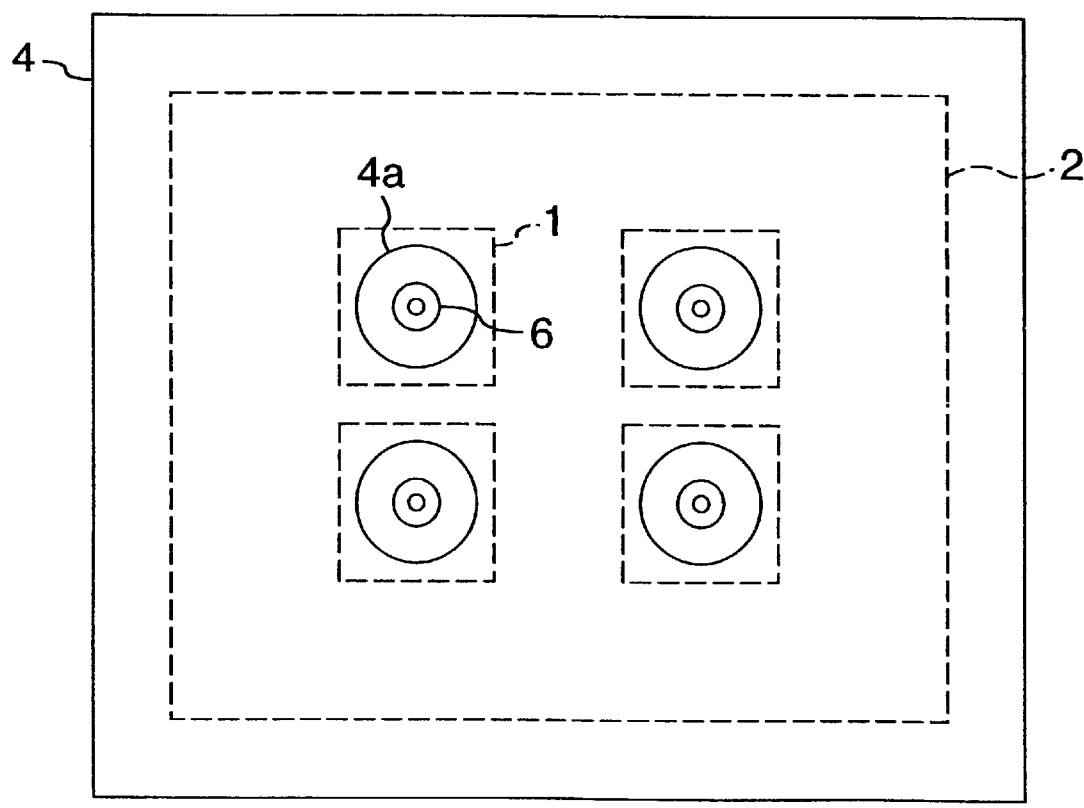
FIG. 2 is a sectional view along line II—II shown in FIG. 1.

In this embodiment, the shape of the recesses 4a are circular in a plan view as shown in FIG. 2. With the circular shape, a plurality of recesses 4a can be formed simultaneously by drilling. Accordingly, it is possible to manufacture the device in a short time in comparison with other shapes.

With the device according to the present invention, it is possible to prevent occurrence of large strain in the solder layers, thereby it is possible to prevent occurrence of fatigue failure in the solder layers.

What is claimed is:

1. A semiconductor device comprising a base, an insulating substrate and a semiconductor chip mounted thereon, said semiconductor chip being joined to a first side of said insulating substrate via a first solder layer and said insulating substrate being joined at a second, opposing side thereof onto the base via a second solder layer, wherein said base has a recess formed therein in a part thereof underneath said semiconductor chip, the recess defining a relatively thin, first part of said base, and wherein said base further has a second part of a thickness larger than that of said first part and surrounding said first part, a thermal expansion of said first part being constrained by said second part so as to prevent occurrence of fatigue failure of the first and second solder layers because of temperature variation.

2. A semiconductor device according to claim 1, wherein said recess, which defines said first part, has a substantially flat inner surface and is formed on a side of said base remote from a side thereof where said semiconductor chip is located.

3. A semiconductor device according to claim 2, wherein said base is made of one of Cu and Al.

4. A semiconductor device comprising a base, an insulating layer and a semiconductor chip mounted thereon, said semiconductor chip being soldered to a first side of said insulating substrate and said insulating substrate being soldered at a second, opposing side thereof onto the base, wherein a recess is formed in said base in a part thereof underneath said semiconductor chip, said recess being such that thermal expansion of said part, vertically beneath said semiconductor chip, is constrained so as to prevent fatigue failure of the solder because of temperature variation; and a passage for supplying a cooling medium into said recess.

5. A semiconductor device according to claim 4, wherein said recess is formed on a side of said base remote from a side thereof where said semiconductor chip is mounted.

6. A semiconductor device according to claim 5, wherein said base is made of one of Cu and Al.

7. A semiconductor device comprising:
at least one semiconductor chip;
an insulating substrate having a first side thereof to which said at least one semiconductor chip is joined by solder; and
a base having a first planar side to which a second, opposing side of said insulating substrate is joined by solder,
wherein said base includes a first part located at an area of said first side thereof covered by said semiconductor chip, said first part being surrounded by a relatively thicker, second part of said base, and
wherein a thermal expansion of said first part is constrained by said second part so as to prevent fatigue failure of the solder because of temperature variation.

8. A semiconductor device according to claim 7, wherein said first part is defined by a recess formed on a second side of said base, opposite said first side thereof.

9. A semiconductor device according to claim 8, wherein there is provided a supply passage for feeding a cooling medium into said recess.

10. A semiconductor device according to claim 8, wherein said recess is circular shaped, with respect to a plan view thereof.

11. A semiconductor device according to claim 8, wherein said base is made of one of Cu and Al.

12. A semiconductor device according to claim 7, wherein said at least one semiconductor chip consists of plural ones of semiconductor chip.

13. A semiconductor device according to claim 12, wherein said base includes one or more of said first part, each first part being located at an area of said first side of said base covered by a corresponding one of the semiconductor chips and being surrounded by the thicker second part of said base.

14. A semiconductor device according to claim 13, wherein each first part is defined by an individual recess formed on a second side of said base, opposite said first side thereof.

15. A semiconductor device according to claim 14, wherein there is provided a supply passage for feeding a cooling medium into each said recess.

16. A semiconductor device according to claim 14, wherein each said recess is circular shaped, with respect to a plan view thereof.

17. A semiconductor device according to claim 7,
wherein at least one semiconductor chip consists of plural ones of said semiconductor chip, and
wherein said base includes a plurality of first parts, equal in number to the number of chips in the plurality of semiconductor chips, each of said first parts being located at a different area of said first side of said base, which is covered by a corresponding one of said semiconductor chips, and being surrounded by the thicker second part of said base.

18. A semiconductor device according to claim 17, wherein each first part is defined by an individual recess formed on a second side of said base, opposite said first side thereof.

19. A semiconductor device according to claim 18, wherein there is provided a supply passage for feeding a cooling medium into each said recess.

20. A semiconductor device according to claim 18, wherein each said recess is circular shaped, with respect to a plan view thereof.

* * * * *